(12) United States Patent
Sinha et al.

(10) Patent No.: US 9,929,149 B2
(45) Date of Patent: Mar. 27, 2018

(54) USING INTER-TIER VIAS IN INTEGRATED CIRCUITS

(71) Applicant: ARM Limited, Cambridge (GB)

(72) Inventors: Saurabh Pijuskumar Sinha, San Antonio, TX (US); Robert Campbell Aitken, San Jose, CA (US); Brian Tracy Cline, Austin, TX (US); Gregory Munson Yeric, Austin, TX (US); Kyungwook Chang, Atlanta, GA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/188,544

(22) Filed: Jun. 21, 2016

(65) Prior Publication Data

US 2017/0365600 A1 Dec. 21, 2017

(51) Int. Cl.
*H01L 27/06* (2006.01)
*H01L 23/528* (2006.01)
(Continued)

(52) U.S. Cl.
CPC ........ *H01L 27/0688* (2013.01); *H01L 23/481* (2013.01); *H01L 23/528* (2013.01);
(Continued)

(58) Field of Classification Search
CPC .......................... H01L 23/481; H01L 27/0688
(Continued)

(56) References Cited

U.S. PATENT DOCUMENTS 8,574,929 B1   11/2013   Or-Bach et al.
8,631,372 B2   1/2014    Yu et al.
(Continued)

FOREIGN PATENT DOCUMENTS

JP    S61180466 A1   8/1986
WO   2014-209278 A1  12/2014

OTHER PUBLICATIONS

Through-silicon via; Wikipedia; Jun. 17, 2016 (accessed Jun. 20, 2016). https://en.wikipedia.org/wiki/Through-silicon_via.
(Continued)

*Primary Examiner* — Moazzam Hossain
*Assistant Examiner* — Warren H Kilpatrick
(74) *Attorney, Agent, or Firm* — Pramudji Law Group PLLC; Ari Pramudji

(57) ABSTRACT

Various implementations described herein may be directed to using inter-tier vias (IVs) in integrated circuits (ICs). In one implementation, a three-dimensional (3D) IC may include a plurality of tiers disposed on a substrate layer, where the tiers may include a first tier having a first active device layer electrically coupled to first interconnect layers, and may also include a second tier having a second active device layer electrically coupled to a second interconnect layer, where the first interconnect layers include an uppermost layer that is least proximate to the first active device layer. The 3D IC may further include IVs to electrically couple the second interconnect layer and the uppermost layer. The uppermost layer may be electrically coupled to a power source at peripheral locations of the first tier, thereby electrically coupling the power source to the first active device layer and to the second active device layer.

20 Claims, 7 Drawing Sheets

(51) Int. Cl.
H01L 23/522 (2006.01)
H01L 23/00 (2006.01)
H01L 23/48 (2006.01)

(52) U.S. Cl.
CPC .......... *H01L 23/5226* (2013.01); *H01L 24/14* (2013.01); *H01L 24/48* (2013.01); *H01L 24/73* (2013.01); *H01L 2224/13025* (2013.01); *H01L 2224/73207* (2013.01)

(58) Field of Classification Search
USPC ...................................................... 257/737
See application file for complete search history.

(56) References Cited

U.S. PATENT DOCUMENTS

| | | | |
|---|---|---|---|
| 8,674,510 | B2 | 3/2014 | Law et al. |
| 8,930,875 | B2 | 1/2015 | Yin |
| 9,147,438 | B2 | 9/2015 | Kamal et al. |
| 9,213,358 | B2 | 12/2015 | Kamal et al. |
| 9,252,133 | B2 | 2/2016 | Collins et al. |
| 9,263,382 | B2 | 2/2016 | Yang et al. |
| 9,287,257 | B2 | 3/2016 | Chao et al. |
| 9,299,649 | B2 | 3/2016 | Chiu et al. |
| 9,331,062 | B1 | 5/2016 | Lane et al. |
| 2004/0232554 | A1 | 11/2004 | Hirano et al. |
| 2010/0308471 | A1 | 12/2010 | Korogi et al. |
| 2012/0006122 | A1 | 1/2012 | Aitken |
| 2013/0256908 | A1 | 10/2013 | Mclaurin |
| 2013/0260510 | A1* | 10/2013 | Theuss ................ H01L 25/0657 438/109 |
| 2014/0367759 | A1 | 12/2014 | Lee et al. |
| 2015/0019802 | A1 | 1/2015 | Kamal et al. |
| 2015/0022250 | A1 | 1/2015 | Kamal et al. |
| 2015/0022262 | A1 | 1/2015 | Du |
| 2015/0235949 | A1* | 8/2015 | Yu ....................... H01L 23/3128 257/774 |
| 2015/0249053 | A1 | 9/2015 | Or-Bach et al. |
| 2015/0333056 | A1 | 11/2015 | Du et al. |
| 2016/0161550 | A1 | 6/2016 | Yeric et al. |

OTHER PUBLICATIONS

Three-dimensional integrated circuit; Wikipedia; Jun. 17, 2016 (accessed Jun. 20, 2016). https://en.wikipedia.org/wiki/Three-dimensional_integrated_circuit.
Flip chip; Wikipedia; Jun. 17, 2016 (accessed Jun. 20, 2016). https://en.wikipedia.org/wiki/Flip_chip.
Integrated circuit; Wikipedia; Jun. 14, 2016 (accessed Jun. 20, 2016). https://en.wikipedia.org/wiki/Integrated_circuit.
Microfabrication; Wikipedia; Jun. 11, 2016 (accessed Jun. 20, 2016). https://en.wikipedia.org/wiki/Microfabrication.
Very-large-scale integration; Wikipedia; Jun. 9, 2016 (accessed Jun. 20, 2016). https://en.wikipedia.org/wiki/Very-large-scale_integration.
Wafer dicing; Wikipedia; Jun. 6, 2016 (accessed Jun. 20, 2016). https://en.wikipedia.org/wiki/Wafer_dicing.
Wafer (electronics); Wikipedia; May 28, 2016 (accessed Jun. 20, 2016). https://en.wikipedia.org/wiki/Wafer_(electronics).
Dielectric; Wikipedia; May 12, 2016 (accessed Jun. 20, 2016). https://en.wikipedia.org/wiki/Dielectric.
Die (integrated circuit); Wikipedia; Apr. 12, 2016 (accessed Jun. 20, 2016). https://en.wikipedia.org/wiki/Die_(integrated_circuit).
Photolithography; Wikipedia; Apr. 8, 2016 (accessed Jun. 20, 2016). https://en.wikipedia.org/wiki/Photolithography.
Semiconductor device fabrication; Wikipedia; Mar. 16, 2016 (accessed Jun. 20, 2016). https://en.wikipedia.org/wiki/Semiconductor_device_fabrication.
Silicon on insulator; Wikipedia; Mar. 10, 2016 (accessed Jun. 20, 2016). https://en.wikipedia.org/wiki/Silicon_on_insulator.
Panth, et al.; Design and CAD methodologies for low power gate-level monolithic 3D ICs; ISLPED; Aug. 2014.
Monolithic 3DIC for SoC: Tech Design Forum; Jun. 25, 2014 (accessed Jun. 20, 2016). http://www.techdesignforums.com/practice/guides/monolithic-3dic-integration/.
Or-Bach; Qualcomm Calls for Monolithic 3D IC; EE Times Blog; Jun. 17, 2014 (accessed Jun. 20, 2016). http://www.eetimes.com/authorasp?doc_id=1322783.
Maxfield; Monolithic 3D IC Technologies; EE Times Blog; Nov. 28, 2013 (accessed Jun. 20, 2016). http://www.eetimes.com/author.asp?section_id=36&doc_id=1320241.
Maxfield; The State of the Art in 3D IC Technologies; EE Times Blog; Nov. 27, 2013 (accessed Jun. 20, 2016). http://www.eetimes.com/authorasp?doc_id=1320240&page_number=3.
Maxfield; 2D vs. 2.5D vs. 3D ICs 101; EE Times Blog; Apr. 8, 2012 (Jun. 20, 2016). http://www.eetimes.com/document.asp?doc_id=1279540.
Nenni, et al.; Three-Dimensional Integrated Circuit Wiki; SemiWiki.com; Nov. 28, 2011 (accessed Jun. 20, 2016). http://www.semiwiki.com/forum/showwiki.php?title=Semi%20Wiki:Three-Dimensional%20Integrated%20Circuit%203D%20IC%20Wiki.
The Problem of Supply Rail IR Drop; VLSI and ASIC Technology Standard Cell Library Design; Nov. 12, 2007 (accessed Jun. 20, 2016). http://www.vlsitechnology.org/html/irdrop_1.html.
PCT International Search Report and Written Opinion; PCT/GB2017/051682; dated Sep. 28, 2017.

* cited by examiner

USING INTER-TIER VIAS IN INTEGRATED CIRCUITS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Various integrated circuit (IC) technologies have been developed which allow multiple IC layers or dies to be positioned in a vertical direction. In particular, in three-dimensional (3D) ICs, a number of IC layers or dies may be stacked in a vertical direction, where various coupling schemes may be used to stack the layers or dies together and to connect the layers or dies to package substrates. Such coupling schemes may include one or more vias used to provide inter-layer communication in the vertical direction.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Figure 1:
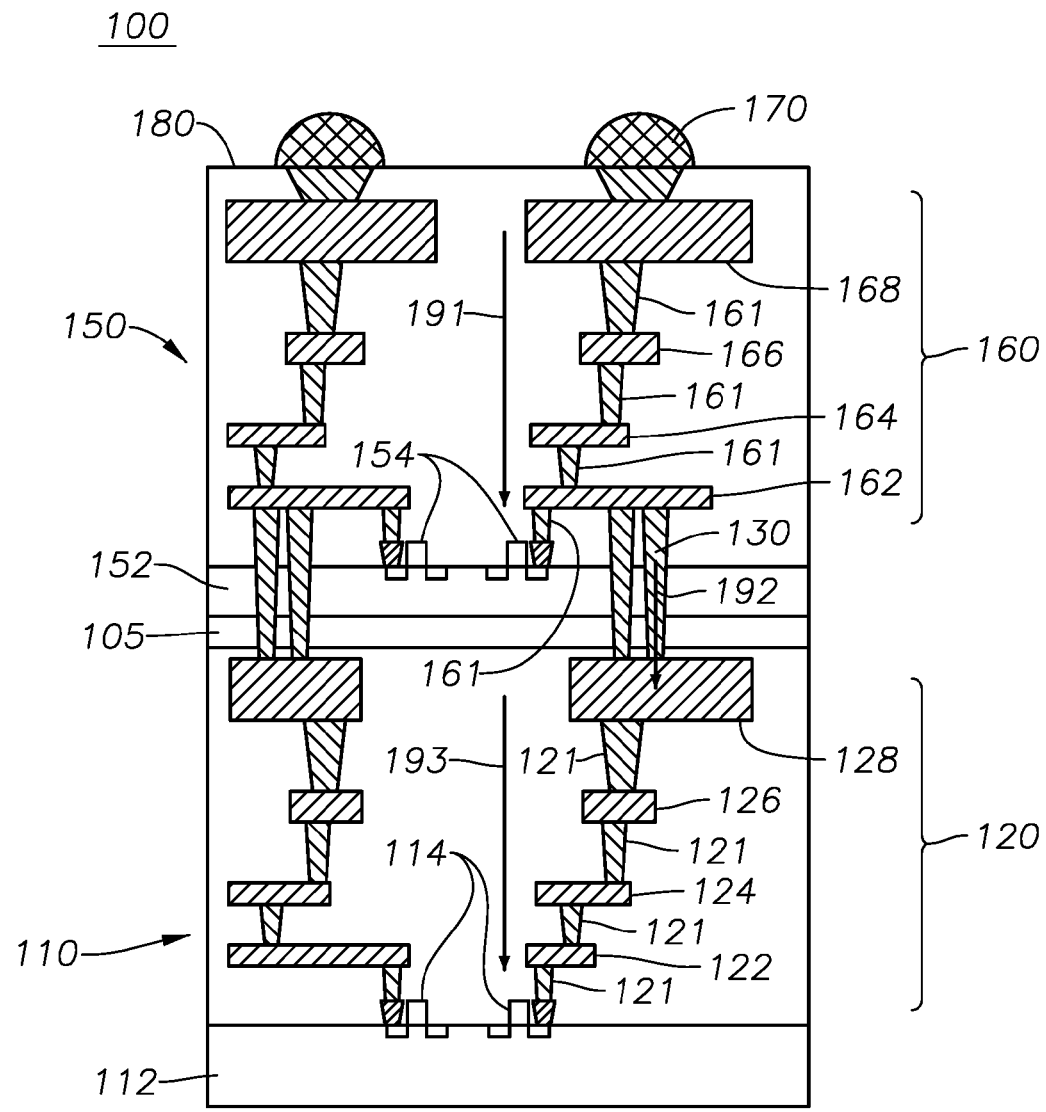
FIGS. 1-2 illustrate a cross-sectional view of a monolithic three-dimensional (3D) integrated circuit (IC) in connection with various implementations described herein.

Various implementations described herein may refer to and may be directed to using inter-tier vias in integrated circuits. For instance, in one implementation, a three-dimensional (3D) integrated circuit (IC) may include a plurality of tiers disposed on a substrate layer, where the plurality of tiers may include a first tier having a first active device layer electrically coupled to one or more first interconnect layers. The plurality of tiers may also include a second tier having a second active device layer electrically coupled to a second interconnect layer, where the first tier is positioned closer to the substrate layer than the second tier, and where the one or more first interconnect layers include an uppermost first interconnect layer that is least proximate to the first active device layer of the first interconnect layers. The 3D IC may further include one or more first inter-tier vias (IVs) configured to electrically couple the second interconnect layer and the uppermost first interconnect layer. The uppermost first interconnect layer may be electrically coupled to a power source at one or more peripheral locations of the first tier, thereby electrically coupling the power source to the first active device layer and to the second active device layer.

Various implementations of using inter-tier vias in integrated circuits will now be described in more detail with reference to FIGS. 1-8.

Integrated circuits (ICs) may be formed from arrangements of one or more input/output devices, standard devices, memory devices, and/or other devices. These devices may be composed of various electronic components, such as transistors, diodes, resistors, capacitors, and/or the like. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like. Memory devices may include memory arrays arranged into memory cells and the associated circuitry to write data to the memory cells and read data from the memory cells.

In some scenarios, an IC may be manufactured in the form of a two-dimensional (2D) IC, as is known in the art, where the electronic components mentioned above may be placed in a single active device layer, which may be formed over a substrate layer. The substrate layer may be composed of any semiconductor material known in the art. In particular, the substrate layer may include silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some implementations, where the substrate layer is an alloy semiconductor, the alloy semiconductor substrate may have a gradient SiGe feature in which the Si and Ge composition may change from one ratio at one location to another ratio at another location of the gradient SiGe feature. In another implementation, the alloy SiGe may be formed over a silicon substrate, and/or the SiGe substrate may be strained. In yet another implementation, the substrate layer may be a semiconductor on insulator (SOI).

In particular, the active device layer may be a layer of processing circuitry, such as in the form of the devices and electronic components mentioned above. The active device layer may be composed of any semiconductor material known in the art. In particular, the active device layer may include silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some implementations, where the substrate layer is an alloy semiconductor, the alloy semiconductor substrate may have a gradient SiGe feature in which the Si and Ge composition may change from one ratio at one location to another ratio at another location of the gradient SiGe feature.

The active device layer may also include various doped regions, as known in the art. For example, the doped regions may include p-type wells or n-type wells. The doped regions may be doped with p-type dopants, such as boron or $BF_2$, and/or n-type dopants, such as phosphorus or arsenic. In some implementations, the doped regions may be formed directly on the substrate layer, in a P-well structure, in an N-well structure, in a dual-well structure, or using a raised structure. In other implementations, the active device layer may be part of the substrate layer. The doped regions may include various active regions, such as regions configured for an N-type metal-oxide-semiconductor (NMOS) transistor and regions configured for a P-type metal-oxide-semiconductor (PMOS) transistor.

The components may be interconnected through one or more interconnect layers that are also within the IC, where the interconnect layers may be composed of metal, and may also include inter-metal dielectric (IMD) layers. The interconnect layers may be formed over the active device layer. Further, as known in the art, vias and/or contacts may also be formed over the active device layer. The interconnect layers and the vias and/or contacts may be composed of conductive material known to those in the art. The IMD layers may be made of one or more dielectric materials, which may include a low dielectric constant (low-k) dielectric material and has a dielectric constant (k value) lower than about 3.5. In one implementation, the k value of dielectric material may be equal to or lower than about 2.5. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, Black Diamond (a product of Applied Materials of Santa Clara, Calif.), Xerogel, Aerogel, amorphous fluorinated carbon, Parylene, bis-benzocyclobutenes (BCB), polyimide, polynorbornenes, benzocyclobutene, PTFE, porous SiLK, hydrogen silsesquioxane (HSQ), methylsilsesquioxane (MSQ), and/or combinations thereof. The low-k dielectric material may be deposited by a chemical vapor deposition (CVD), plasma enhanced CVD (PECVD), or spin-on process. The low-k dielectric could also be an extreme low-k dielectric (ELK). The ELK material may have a dielectric constant of less than about 2.5. Such ELK materials may include porous low-k materials. In some embodiments, the ELK may be a silicon oxide based low-k material having a porous structure, which is adapted to a porogen-doped SiCO-based material by incorporating a porogen (or a porogen material) into a carbon-doped oxide dielectric. Other materials may also be used.

In a further implementation, the 2D IC may be disposed on a package substrate, where the package substrate may be any semiconductor substrate known in the art, such as a silicon substrate, a silicon-germanium substrate, a III-V compound substrate, a silicon on insulator (SOI) substrate, and/or the like.

In 2D ICs, space for wired connections between circuit elements in two-dimensional directions (i.e., along x and y axes relative to the package substrate) may be at a premium. As such, various IC technologies have been developed which allow multiple IC layers or dies to be positioned in a vertical direction (i.e., along a z axis) with respect to a package substrate. Such ICs may be referred to as three-dimensional (3D) ICs.

For example, a three-dimensional (3D) IC may be utilized where the 3D IC may have multiple dies stacked together on a package substrate, which may be similar to the package substrate of the 2D IC. Such a 3D IC may hereinafter be referred to as a stacked 3D IC.

Each of the dies may include a substrate layer and an active device layer. The substrate layer may be composed of any semiconductor material known in the art, and may be similar to the substrate layer of the 2D IC. The active device layer may be a layer of processing circuitry, such as in the form of the devices and electronic components mentioned above. The active device layer may be composed of any semiconductor material known in the art, and may be similar to the active device layer of the 2D IC.

Each die may also include one or more interconnect layers, where the interconnect layers may be composed of metal, and may also include IMD layers. The interconnect layers may be formed over the active device layer. Further, as known in the art, vias and/or contacts may also be formed over the active device layer. The interconnect layers and the vias and/or contacts may be composed of conductive material known to those in the art, and may be similar to those discussed above with respect to the 2D IC.

Further, various coupling schemes may be used to stack the dies together and to connect the dies of the stacked 3D IC to the package substrate. As is known in the art, wire-bonding, flip chip bonding (e.g., solder bumps), and/or through silicon vias (TSVs) may be used to electrically couple the dies together and to electrically couple the dies to package substrates. The TSVs may pass completely through one or more of the dies, allowing for electrical connections to be made between adjacent dies and between non-adjacent dies, and may pass power and/or signals to one or more of the dies. The TSVs may use bumps that sit on pads to provide electrical communication between the dies.

In another example, the 3D IC may be a monolithic 3D IC. The monolithic 3D IC may have a plurality of tiers disposed on top of one another on a substrate layer in a vertical direction (i.e., along a z axis relative to the substrate layer), where the tiers may be formed and deposited upon one another using hydrogen cutting or any monolithic tier formation method known to those in the art. The substrate layer may be composed of any semiconductor material known in the art, and may be similar to the substrate layers of the 2D IC and the stacked 3D IC. The tiers may be formed in a single die with multiple intervening interconnect layers. The plurality of tiers may allow for the performance of different functions by the 3D IC.

Each tier may include an active device layer and one or more interconnect layers. The active device layer may be a layer of processing circuitry, such as in the form of the devices and electronic components mentioned above. The active device layer may be composed of any semiconductor material known in the art, and may be similar to the active device layers of the 2D IC and the stacked 3D IC. The interconnect layers may be composed of metal, and may also include IMD layers. The interconnect layers may be formed over the active device layer. Further, as known in the art, vias and/or contacts may also be formed over the active device layer. The interconnect layers and the vias and/or contacts may be composed of conductive material known to those in the art, and may be similar to those discussed above with respect to the 2D IC and the stacked 3D IC.

As noted above, the tiers may be formed and built upon one another using any monolithic tier formation method known to those in the art, such that the monolithic 3D IC may have multiple tiers disposed on top of one another on a substrate layer. In a further implementation, the tiers may be separated by a dielectric layer, where the dielectric layer may be composed of any dielectric materials known to those in the art, including those discussed above with respect to the IMD layers. Adjacent tiers may also be electrically coupled to one another using monolithic inter-tier vias (MIVs), as known to those skilled in the art. When compared to the TSVs, the MIVs may each be much smaller in diameter and depth. For example, the diameter of the MIVs may be less than 100 nm, whereas the TSVs may each have a diameter along the micron dimensions.

In one implementation, the MIVs may be used to electrically couple a bottommost interconnect layer of one tier with the uppermost interconnect layer of another tier. For example, FIG. 1 illustrates a cross-sectional view of a monolithic 3D IC 100 in connection with various implementations described herein. As shown, the 3D IC 100 includes a first tier 110 and a second tier 150 disposed on a substrate layer (not shown), where the tiers are adjacent to, and disposed on top of, one another. In particular, the second tier 150 may be considered the upper tier and the first tier 110 may be considered the lower tier, as the first tier 110 may be more proximate to the substrate layer. Although two tiers are shown, those skilled in the art understand that more than two tiers may be used in the monolithic 3D IC 100. Further, as shown, a dielectric layer 105 may be positioned between the first tier 110 and the second tier 150 such that the layer 105 separates the two tiers.

The first tier 110 may include a first active device layer 112, where the first active device layer 112 may include various doped regions that form one or more transistors 114 in the layer 112. The first tier 110 may also include first interconnect layers 120, which include four interconnect layers 122, 124, 126, and 128. Although four interconnect layers are shown, those skilled in the art understand that more or less than four interconnect layers may be used. As shown, adjacent first interconnect layers 120 may be electrically coupled to one another using vias 121, and the bottommost layer 122 of the first interconnect layers 120 may be coupled to the first active device layer 112 using a via 121. In one implementation, the bottommost layer 122 may be the first interconnect layer 120 that is most proximate to the first active device layer 112.

Similarly, the second tier 150 may include a second active device layer 152, where the second active device layer 152 may include various doped regions that form one or more transistors 154 in the layer 152. The second tier 150 may also include second interconnect layers 160, which include four interconnect layers 162, 164, 166, and 168. Although four interconnect layers are shown, those skilled in the art understand that more or less than four interconnect layers may be used. As shown, adjacent second interconnect layers 160 may be electrically coupled to one another using vias 161, and the bottommost layer 162 of the second interconnect layers 160 may be coupled to the second active device layer 152 using a via 161. In one implementation, the bottommost layer 162 may be the second interconnect layer 160 that is most proximate to the second active device layer 152.

The monolithic 3D IC 100 may also include MIVs 130 used to electrically couple the first tier 110 and the second tier 150. In particular, the MIVs 130 may be used to electrically couple the bottommost layer 162 of the second interconnect layers 160 and an uppermost layer 128 of the first interconnect layers 120. In one implementation, the uppermost layer 128 may be the first interconnect layer 120 that is least proximate to the first active device layer 112. By electrically coupling the bottommost layer 162 and the uppermost layer 128, a conductive path may be formed between the first tier 110 and the second tier 150.

As also shown, the monolithic 3D IC 100 may also include one or more solder bumps 170 that may be disposed at a top side 180 of the IC 100, which may be the side of the IC 100 that lies farthest away from the substrate (not pictured). The solder bumps 170 may be solder balls, metal pillars, controlled collapse chip connection (C4) bumps, wire-bonds, and/or the like.

As shown, the top side 180 may be part of the second tier 150, and the solder bumps 170 may be electrically coupled to an uppermost layer 168 of the second interconnect layers 160. In one implementation, the uppermost layer 168 may be the second interconnect layer 160 that is least proximate to the second active device layer 152. The solder bumps 170 may be used to provide power, a clock signal, an input signal, or combinations thereof from an external source to the monolithic 3D IC 100. Using the interconnect layers 120, 160 and the MIVs 130, as shown, the solder bump 170 may be part of a conductive path that supplies power, the clock signal, the input signal, or combinations thereof to the first active device layer 112 and the second active device layer 152. In particular, the conductive path may supply the power and signals to the transistors 114 and 154. The conductive path is at least partly illustrated by arrows 191, 192, and 193.

However, the conductive path supplying the power and signals from the top side 180 of the IC 100 may experience electrical challenges. For example, with the combined metal lengths of the first interconnect layers 120, the MIVs 130, and the second interconnect layers 160, power supplied to IC 100 may experience a significant voltage drop due to current (I) and resistance (R) (i.e., IR drop) before the power may reach the active device layers 112 and 152. Further, the power supplied to the IC 100 may also experience inductive losses, such as with the use of wire-bond inputs, and dynamic power drops (e.g., L*di/dt). In addition, a clock signal provided to the IC 100 may undergo lag and/or skew as it travels from the input 170 to the active device layers 112 and 152. Further, an input signal provided to the IC 100 may experience signal degradation as it travels from the input 170 to the active device layers 112 and 152. Similar electrical challenges may occur in the 2D IC and the stacked 3D IC described above.

In view of the above, various implementations of using MIVs in ICs are described herein, where such implementations may attenuate these electrical challenges.

3D IC Using Inter-Tier Vias

Implementations of using inter-tier vias (IVs) in 3D ICs are described herein. Although the implementations below are described with respect to monolithic 3D ICs, those skilled in the art will understand that the implementations may also be applied to stacked 3D ICs.

Figure 2:
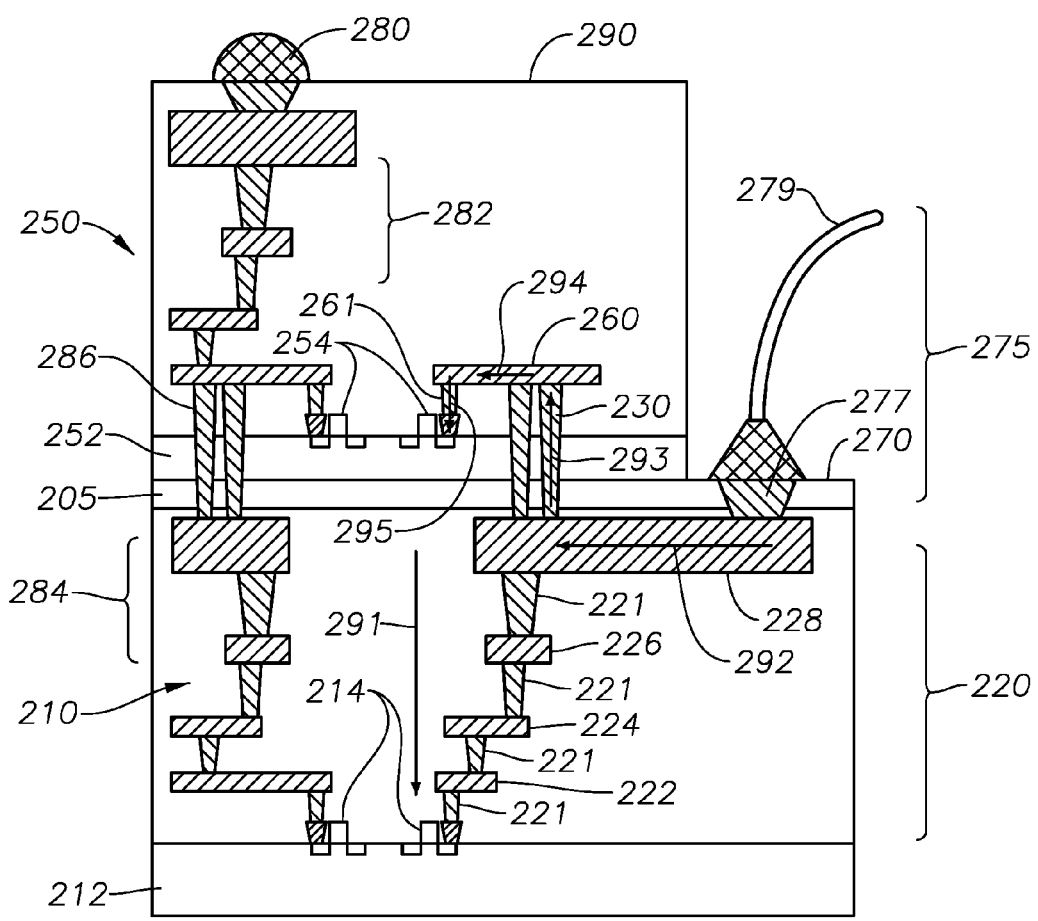

In particular, a 3D IC may use IVs in order to receive power, a clock signal, an input signal, or combinations thereof from an external source at a location that is below a top side of the 3D IC. In one implementation, the IVs may be in the form of TSVs, MIVs, and/or any other vias known to those skilled in the art. In another implementation, such IVs may be smaller than the TSVs mentioned above, and may be comparable in size to the MIVs discussed above. In one such implementation, FIG. 2 illustrates a cross-sectional view of a monolithic 3D IC 200 in accordance with various implementations described herein. The 3D IC 200 may be similar to the monolithic 3D ICs discussed above.

As shown, the 3D IC 200 includes a first tier 210 and a second tier 250 disposed on a substrate layer (not shown), where the tiers are adjacent to, and disposed on top of, one another. In particular, the second tier 250 may be considered the upper tier and the first tier 210 may be considered the lower tier, as the first tier 210 may be more proximate to the substrate layer. Although two tiers are shown, those skilled in the art understand that more than two tiers may be used in the monolithic 3D IC 200. Further, as shown, a dielectric layer 205 may be positioned between the first tier 210 and the second tier 250 such that the layer 205 separates the two tiers.

The first tier 210 may include a first active device layer 212, where the first active device layer 212 may include various doped regions that form one or more transistors 214 in the layer 212. The first tier 210 may also include first interconnect layers 220, which include four interconnect layers 222, 224, 226, and 228. Although four interconnect layers are shown, those skilled in the art understand that more or less than four interconnect layers may be used. As shown, adjacent first interconnect layers 220 may be electrically coupled to one another using vias 221, and a bottommost layer 222 of the first interconnect layers 220 may be coupled to the first active device layer 212 using a via 221. In one implementation, the bottommost layer 222 may be the first interconnect layer 220 that is most proximate to the first active device layer 212. Conversely, an uppermost layer 228 of the first interconnect layers 220 may include the first interconnect layer 220 that is least proximate to the first active device layer 212.

Similarly, the second tier 250 may include a second active device layer 252, where the second active device layer 252 may include various doped regions that form one or more transistors 254 in the layer 252. The second tier 250 may also include at least one second interconnect layer 260. Although one second interconnect layer 260 is shown, those skilled in the art understand that more than one second interconnect layer 260 may be used. If more than one second interconnect layer 260 is used, then the second interconnect layer 260 as discussed herein may represent the bottommost second interconnect layer, where the bottommost second interconnect layer is the layer most proximate to the second active device layer 252. As shown, the second interconnect layer 260 may be electrically coupled to the second active device layer 252 using a via 261.

As also shown in FIG. 2, the first tier 210 may extend beyond the second tier 250. In particular, the first tier 210 may be bigger in size and have a greater area than the second tier 250. The monolithic 3D IC 200 may also include one or more MIVs 230 used to electrically couple the first tier 210 and the second tier 250. In particular, the MIVs 230 may be used to electrically couple the second interconnect layer 260 and the uppermost layer 228 of the first interconnect layers 220.

As also shown, the monolithic 3D IC 200 may also include at least one peripheral input structure 275 that may be disposed at a top side 270 of the first tier 210. The top side 270 may be the side of the first tier 210 that lies farthest away from the substrate (not pictured). Further, the peripheral input structure 275 may be positioned at a peripheral location of the first tier 210, where the peripheral location may be a location that is proximate to an edge of the top side 270 of the first tier 210. Due to the difference in size between the tiers, the peripheral input structure 275 may also be positioned to be adjacent to a side of the second tier 250.

The peripheral input structure 275 may include a contact 277 that is electrically coupled to a wire-bond input 279. The wire-bond input 279 may be configured to receive power, a clock signal, an input signal, or combinations thereof from an external source. In another implementation, a solder bump similar to the solder bump 170 above may be used instead of a wire-bond input.

In addition, the contact 277 may also be electrically coupled to the uppermost layer 228 of the first interconnect layers 220. As such, the uppermost layer 228 of the first interconnect layers 220 may be configured to receive power, a clock signal, an input signal, or combinations thereof from the peripheral input structure 275. Using the first interconnect layers 220, the uppermost layer 228 may then provide the power and/or signals to the first active device layer 212 using a conductive path between the two layers. In particular, the conductive path may supply the power and signals to the one or more transistors 214. This conductive path is at least partly illustrated by arrows 291 and 292.

Further, using the second interconnect layer 260 and the MIVs 230, the uppermost layer 228 may then provide the power and/or signals to the second active device layer 252 using a conductive path between the two layers. In particular, the conductive path may supply the power and signals to the one or more transistors 254. This conductive path is at least partly illustrated by arrows 292, 293, 294, and 295.

This relatively short conductive path between the uppermost layer 228 and the second active device layer 252 may lead to fewer electrical challenges discussed above (e.g., IR drop) with respect to the second active device layer 252. In particular, a shorter conductive path may reduce interconnect resistance, which may reduce delay and improve IC performance for the second active device layer 252. In addition, while the conductive path between the uppermost layer 228 and the first active device layer 212 may experience some of the electrical challenges discussed above (e.g., IR drop), the conductive path between the uppermost layer 228 and the first active device layer 212 is shorter than the conductive path discussed above with respect to FIG. 1, and thus may lead to fewer such electrical challenges with respect to the first active device layer 212. In particular, a shorter conductive path may reduce interconnect resistance, which may reduce delay and improve IC performance for the first active device layer 212.

Moreover, with respect to at least the second tier 250, the relatively short conductive path between the uppermost layer 228 and the second active device layer 252 may lead to a lessening of routing congestion in the 3D IC 200. In particular, in contrast to the use of multiple second interconnect layers 160 in IC 100 of FIG. 1, the second tier 250 may use a single second interconnect layer 260 to provide the power and/or signals to the second active device layer 252. This may free up space and/or any remaining second interconnect layers for other uses.

As is also shown in FIG. 2, the 3D IC 200 may also include a conductive path that is similar to the path described above with respect to FIG. 1, where the conductive path may be formed from a solder bump 280, multiple sets of interconnect layers 282 and 284, and MIVs 286. In such an implementation, the solder bump 280 and the peripheral input structure 275 may each receive power, the clock signal, or an input signal to be received by the active device layers. For example, the solder bump 280 may receive the input signal from an external source, whereas the peripheral input structure 275 may receive power from an external source. The solder bump 280 may be solder balls, metal pillars, controlled collapse chip connection (C4) bumps, and/or the like. The solder bumps 280 may also be positioned proximate to a center of the IC 200, and may be positioned on a top side 290 of the second tier 250. The top side 290 may be the side of the second tier 250 that lies farthest away from the substrate (not pictured).

Figure 3:
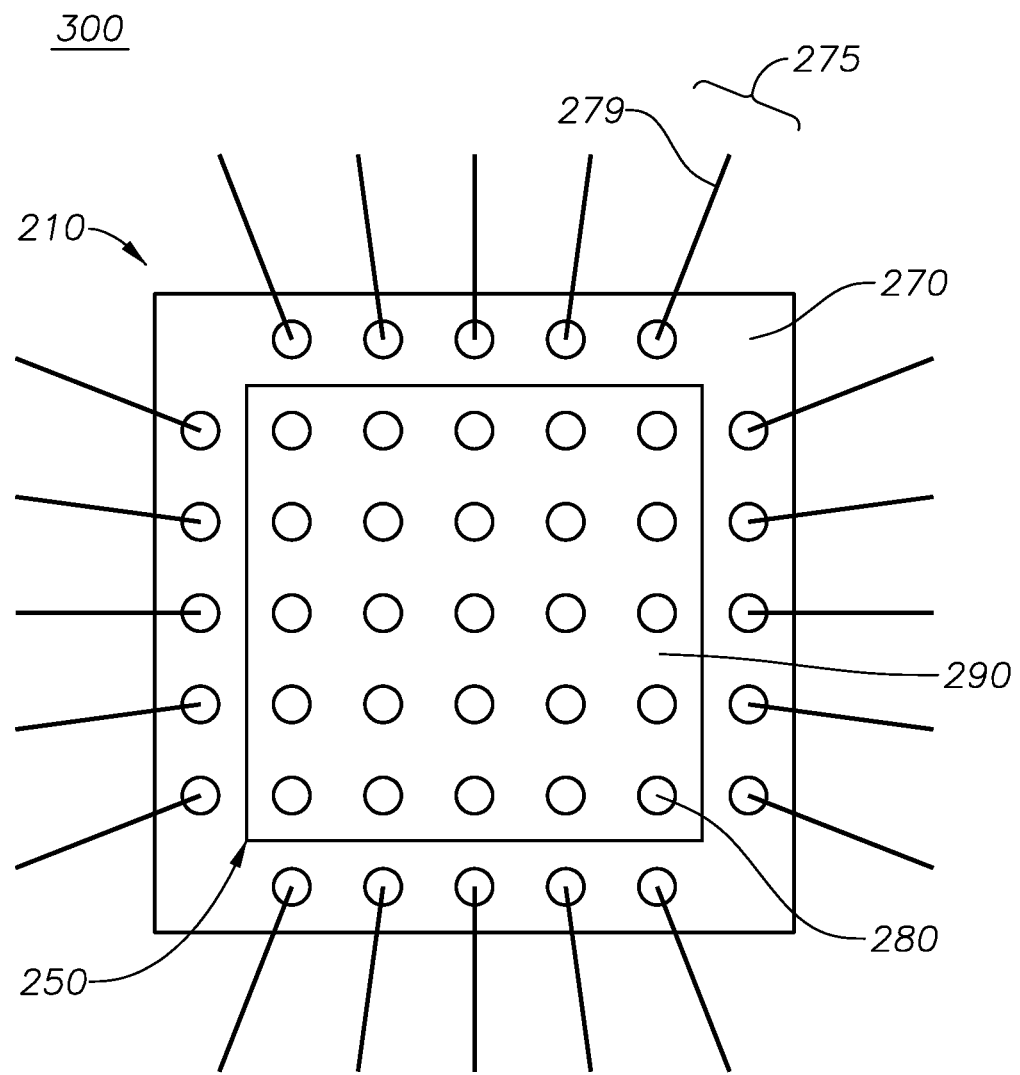
FIG. 3 illustrates a top view of a monolithic 3D IC in accordance with various implementations described herein.

In another implementation, FIG. 3 illustrates a top view of a monolithic 3D IC 300 in accordance with various implementations described herein. The monolithic 3D IC 300 may be the same as the IC 200 of FIG. 2, except the 3D IC 300 may include a plurality of peripheral input structures 275 positioned proximate to an edge of the top side 270 of the first tier 210. The 3D IC 300 may also include a plurality of solder bumps 280 positioned on a top side 290 of the second tier 250. As shown, the first tier 210 may be bigger in size and have a greater area than the second tier 250.

In a further implementation, the monolithic 3D IC may include more than two tiers. In such an implementation, the 3D IC may include the MIVs that are used to receive power, the clock signal, the input signal, or combinations thereof at one or more peripheral input structures. Further, the peripheral input structures may be located below a top side of the top tier of the 3D IC, where the top side of the top tier may be the side of the IC that lies farthest away from the substrate (not pictured). In another implementation, the peripheral input structures may be disposed at a top side of a tier that is positioned adjacent to the top tier of all the tiers in the IC. In yet another implementation, the peripheral input structures may be disposed at a top side of a tier that is positioned approximately in the middle of all the tiers in the IC. Such an implementation may minimize the electrical challenges discussed above. In yet another implementation, the peripheral input structures may be disposed at a top side of a tier that is positioned approximately near the bottom of all the tiers in the IC.

Figure 4:
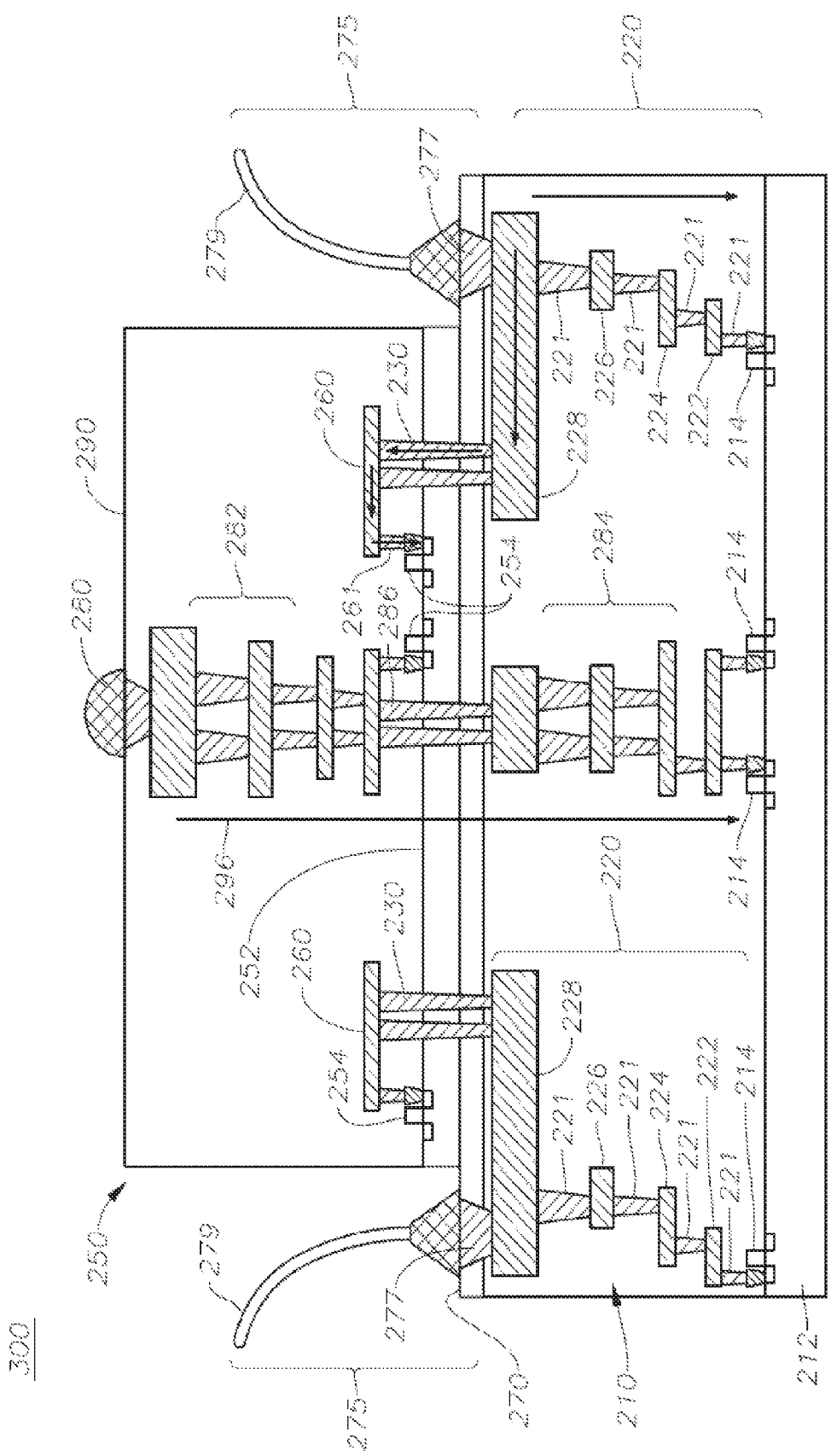
FIGS. 4-6 illustrate a cross-sectional view of a monolithic 3D IC in accordance with various implementations described herein.

FIG. 4 illustrates a further cross-sectional view of the monolithic 3D IC 300 in accordance with various implementations described herein. As noted above, the 3D IC 300 may be similar to the monolithic 3D IC 200 discussed above, except the 3D IC 300 may include a plurality of peripheral input structures 275, multiple instances of the first interconnect layers 220, and multiple instances of the second interconnect layer 260, as shown in FIG. 4. Each of the peripheral input structures 275 may be disposed at the top side 270 of the first tier 210. Further, the peripheral input structure 275 may be positioned at a peripheral location of the first tier 210, where the peripheral location may be a location that is proximate to an edge of the top side 270 of the first tier 210.

Each peripheral input structure 275 may also be coupled to the uppermost layer 228 of one set of first interconnect layers 220. The uppermost layer 228 may then provide the power and/or signals to the first active device layer 212 using a conductive path between the two layers. Further, using one instance of the second interconnect layer 260 and the MIVs 230, the uppermost layer 228 may then provide the power and/or signals to the second active device layer 252 using a conductive path between the two layers.

The 3D IC 300 may also include a plurality of solder bumps 280, though only one is illustrated. The solder bumps 280 may be positioned proximate to a center of the IC 300, and may be positioned on the top side 290 of the second tier 250. As is also shown in FIG. 4, multiple sets of interconnect layers 282 and 284 (though one set shown), and MIVs 286 may also be positioned proximate to the center of the IC 300. The solder bumps 280, the multiple sets of interconnect layers 282 and 284, and the MIVs 286 may form conductive paths 296 that are similar to the conductive path described above with respect to FIG. 1.

In one implementation, power may be provided from an external source at both the peripheral input structures 275 and the solder bumps 280. By providing power from both approximately near the center and the periphery of the IC 300, IR drop resulting from a lateral resistance of the wire-bonds 279 may decrease. In a further implementation, a portion of the peripheral input structures 275 and/or the solder bumps 280 may provide a clock signal and/or input signal.

Figure 5:
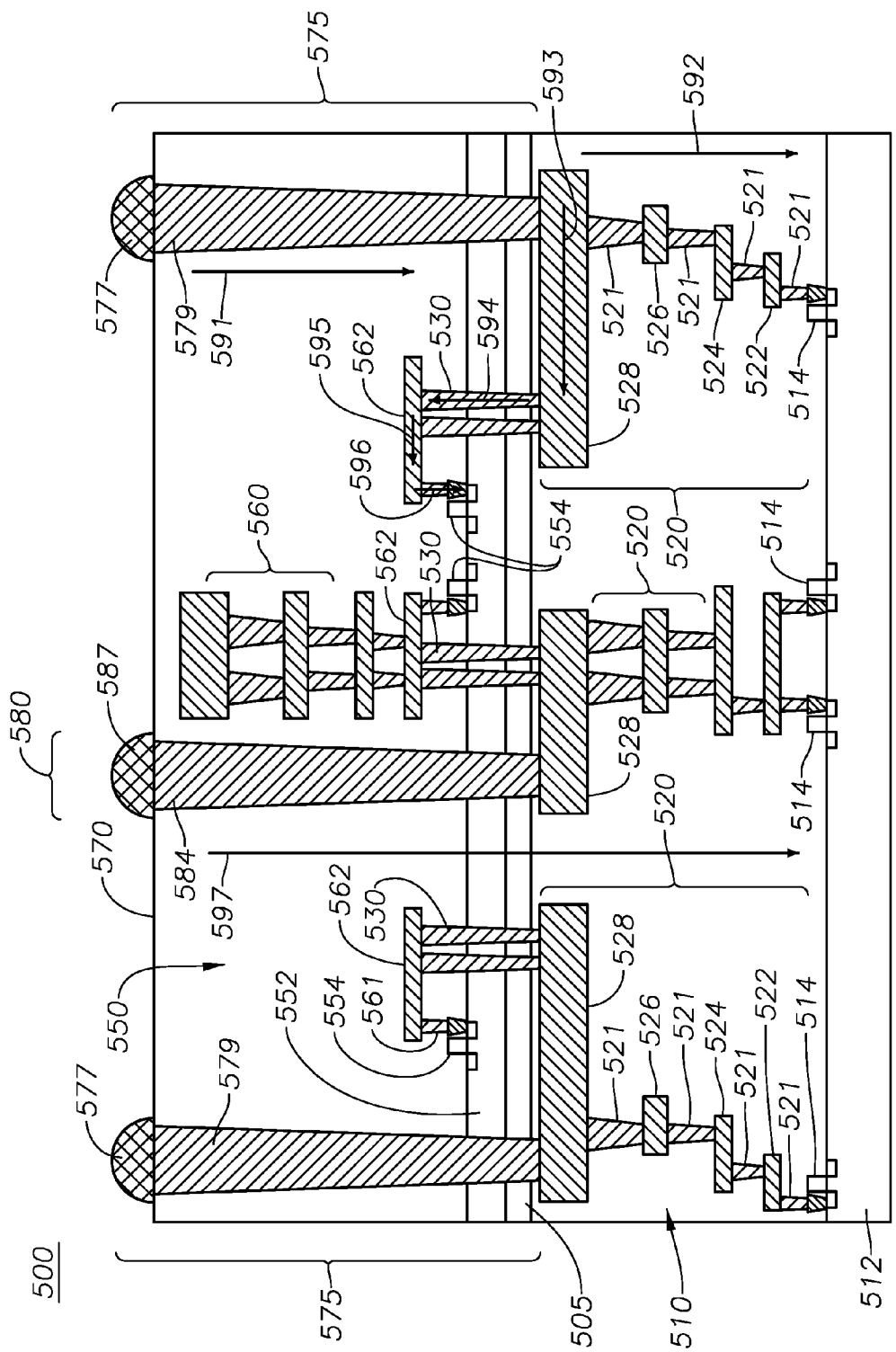

In another implementation, FIG. 5 illustrates a cross-sectional view of a monolithic 3D IC 500 in accordance with various implementations described herein. The 3D IC 500 may be similar to the monolithic 3D ICs discussed above, such as IC 200 and IC 300.

As shown, the 3D IC 500 includes a first tier 510 and a second tier 550 disposed on a substrate layer (not shown), where the tiers are adjacent to, and disposed on top of, one another. In particular, the second tier 550 may be considered the upper tier and the first tier 510 may be considered the lower tier, as the first tier 510 may be more proximate to the substrate layer. Although two tiers are shown, those skilled in the art understand that more than two tiers may be used in the monolithic 3D IC 500. Further, as shown, a dielectric layer 505 may be positioned between the first tier 510 and the second tier 550 such that the layer 505 separates the two tiers.

The first tier 510 may include a first active device layer 512, where the first active device layer 512 may include various doped regions that form one or more transistors 514 in the layer 512. The first tier 510 may also include multiple sets of first interconnect layers 520, where each set includes four interconnect layers 522, 524, 526, and 528. Although four interconnect layers are shown, those skilled in the art understand that more or less than four interconnect layers may be used. As shown, adjacent first interconnect layers 520 in a set may be electrically coupled to one another using vias 521, and a bottommost layer 522 of the first interconnect layers 520 may be coupled to the first active device layer 512 using a via 521. In one implementation, the bottommost layer 522 may be the first interconnect layer 520 that is most proximate to the first active device layer 512. Conversely, an uppermost layer 528 of the first interconnect layers 520 may be the first interconnect layer 520 that is least proximate to the first active device layer 512.

Similarly, the second tier 550 may include a second active device layer 552, where the second active device layer 552 may include various doped regions that form one or more transistors 554 in the layer 552. The second tier 550 may also include multiple sets of second interconnect layers 560, where each set includes one to four interconnect layers. Those skilled in the art understand that more or less than four interconnect layers may be used. The second interconnect layers 560 include at least a bottommost second interconnect layer 562. The bottommost layer 562 of the second interconnect layers 560 may be coupled to the second active device layer 552 using a via 561. For instances where a set of second interconnect layers 560 includes more than one layer, the bottommost layer 562 may be the second interconnect layer 560 that is most proximate to the second active device layer 552.

As also shown in FIG. 5, the first tier 510 may be the same size and have the same area as the second tier 550. The monolithic 3D IC 500 may also include one or more MIVs 530 used to electrically couple the first tier 510 and the second tier 550. For example, the MIVs 530 may be used to electrically couple the bottommost second interconnect layer 562 of the second interconnect layers 560 and the uppermost layer 528 of the first interconnect layers 520.

As also shown, the monolithic 3D IC 500 may also include a plurality of peripheral input structures 575 that may be disposed at least partially at a top side 570 of the second tier 550. The top side 570 may be the side of the second tier 550 that lies farthest away from the substrate (not pictured). Further, the peripheral input structures 575 may be positioned at peripheral locations of the second tier 550, where the peripheral locations may be locations that are proximate to an edge of the second tier 550.

Each peripheral input structure 575 may include a solder bump 577 that is electrically coupled to a TSV 579. The solder bump 577 may be disposed at the top side 570 and configured to receive power, a clock signal, an input signal, or combinations thereof from an external source. The solder bumps 577 may be solder balls, metal pillars, controlled collapse chip connection (C4) bumps, and/or the like. The TSV 579 may be electrically coupled to an uppermost layer 528 of a set of the first interconnect layers 520. As such, each uppermost layer 528 of the first interconnect layers 520 may be configured to receive power, a clock signal, an input signal, or combinations thereof from a peripheral input structure 575. Using the first interconnect layers 520, the uppermost layer 528 may then provide the power and/or signals to the first active device layer 512 using a conductive path between the two layers. In particular, the conductive path may supply the power and signals to the one or more transistors 514. This conductive path is at least partly illustrated by arrows 591 and 592.

Further, using the bottommost second interconnect layer 562 of the second interconnect layers 560 and the MIVs 530, the uppermost layer 528 may then provide the power and/or signals to the second active device layer 552 using a conductive path between the two layers. In particular, the conductive path may supply the power and signals to the one or more transistors 554. This conductive path is at least partly illustrated by arrows 591, 593, 594, 595, and 596.

The conductive path represented by arrows 591 and 592 (i.e., includes solder bump 577, TSV 579, and the first interconnect layers 520) uses fewer elements to provide power and/or signals to the first active device layer 512, as compared to the multiple interconnect layers discussed in FIG. 1, and thus may lead to fewer electrical challenges discussed above (e.g., IR drop). In particular, by using fewer elements, the conductive path represented by arrows 591 and 592 may reduce interconnect resistance, which may reduce delay and improve IC performance with respect to the first active device layer 512. In addition, the conductive path represented by arrows 591, 593, 594, 595, and 596 may be a relatively short conductive path, and may lead to fewer electrical challenges discussed above (e.g., IR drop) with respect to the second active device layer 552. In particular, a shorter conductive path may reduce interconnect resistance, which may reduce delay and improve IC performance for the second active device layer 552.

As is also shown in FIG. 5, the 3D IC 500 may also include one or more conductive paths 597 proximate to the center of the 3D IC 500 that are similar to the paths positioned along the periphery of the 3D IC 500. In particular, one or more central input structures 580 may be disposed at least partially at a top side 570 of the second tier 550. The central input structures 580 may be positioned at central locations of the second tier 550, where the central locations may be locations that are proximate to the center of the second tier 550. Each central input structure 580 may include a solder bump 587 that is electrically coupled to a TSV 584, where solder bumps 587 and the TSV 584 are similar to those described above. The solder bumps 587 may be configured to receive power, a clock signal, an input signal, or combinations thereof from an external source. The TSV 584 may also be electrically coupled to an uppermost layer 528 in a similar manner as the TSV 579, and may provide the power and/or signals to the first active device layer 512 and the second active device layer 552 in a similar manner.

In a further implementation, the monolithic 3D IC 500 may include more than two tiers. In one implementation, the peripheral and central input structures may be disposed at a top side of the top tier in the IC 500. In such an implementation, the TSVs of the input structures may extend through multiple tiers in order to electrically couple with an uppermost layer 528, where the uppermost layer 528 may be positioned at a location that is proximate to a middle tier of the IC 500. By using peripheral and central input structures that utilize solder bumps and TSVs, the 3D IC 500 may experience less inductive noise than if wire-bonds were used, such as in FIGS. 2-4.

Figure 6:
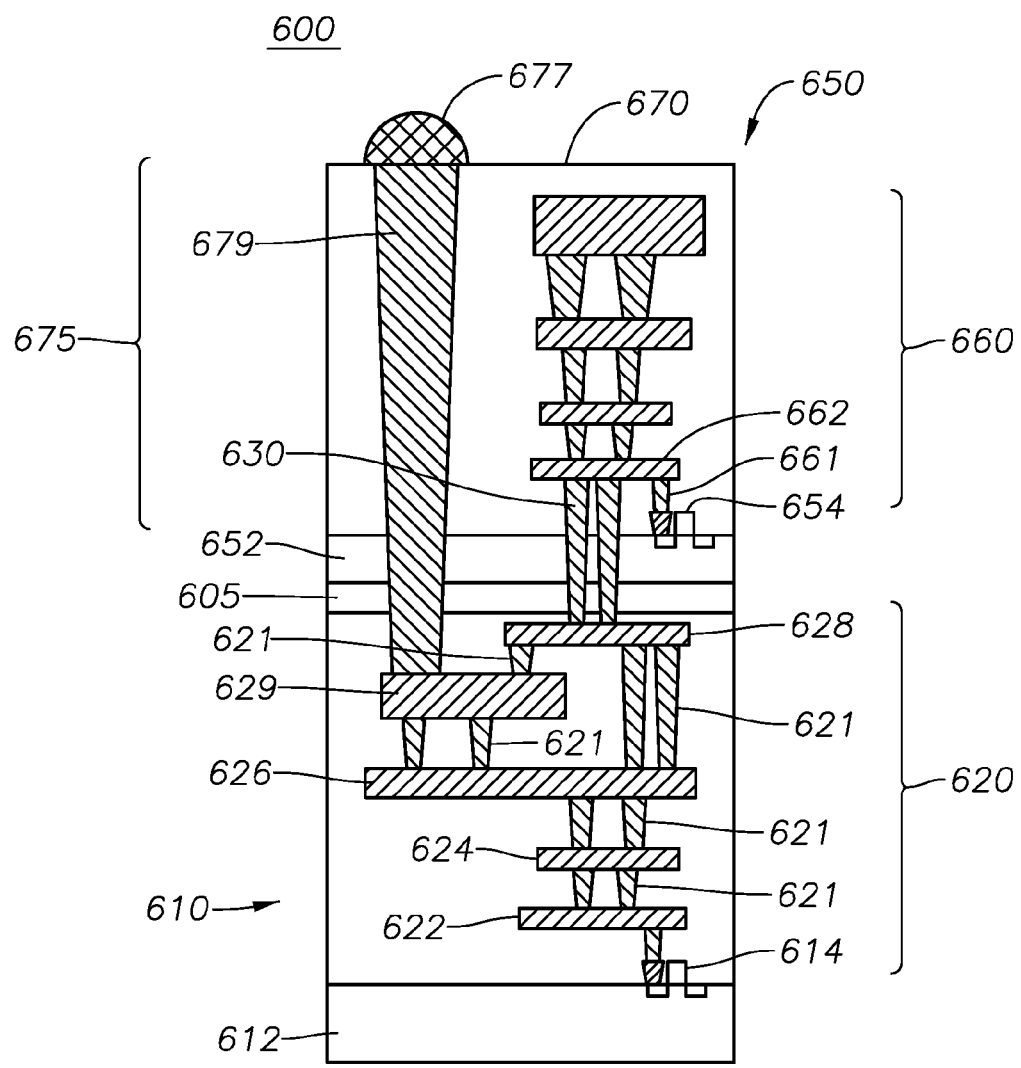

In another implementation, FIG. 6 illustrates a cross-sectional view of a portion of a monolithic 3D IC 600 in accordance with various implementations described herein. The 3D IC 600 may be similar to the monolithic 3D IC 500 discussed above. As shown, the 3D IC 600 includes a first tier 610 and a second tier 650 disposed on a substrate layer (not shown), where the tiers are adjacent to, and disposed on top of, one another. In particular, the second tier 650 may be considered the upper tier and the first tier 610 may be considered the lower tier, as the first tier 610 may be more proximate to the substrate layer. Although two tiers are shown, those skilled in the art understand that more than two tiers may be used in the monolithic 3D IC 600. Further, as shown, a dielectric layer 605 may be positioned between the first tier 610 and the second tier 650 such that the layer 605 separates the two tiers.

The first tier 610 may include a first active device layer 612, where the first active device layer 612 may include various doped regions that form one or more transistors 614 in the layer 612. The first tier 610 may also include first interconnect layers 620. The first interconnect layers 620 include five interconnect layers 622, 624, 626, 629, and 628. Although five interconnect layers are shown, those skilled in the art understand that more or less than five interconnect layers may be used. As shown, adjacent first interconnect layers 622, 624, 626, 629, and 628 may be coupled to one another using vias 621, and the bottommost layer 622 of the first interconnect layers 620 may be coupled to the first active device layer 612 using a via 621. In one implementation, the bottommost layer 622 may be the first interconnect layer 620 that is most proximate to the first active device layer 612. In addition, non-adjacent first interconnect layers 628 and 626 may be coupled to one another using one or more vias 621. In addition, an uppermost layer 628 may be the first interconnect layer 620 that is least proximate to the first active device layer 612, and the layer 629 may be adjacent to the uppermost layer 628. Layer 629 may be larger in pitch, width, and/or space than the uppermost layer 628.

Similarly, the second tier 650 may include a second active device layer 652, where the second active device layer 652 may include various doped regions that form one or more transistors 654 in the layer 652. The second tier 650 may also include second interconnect layers 660, where each set includes four interconnect layers. The second interconnect layers 660 include at least a bottommost second interconnect layer 662. Although four interconnect layers are shown, those skilled in the art understand that more or less than four interconnect layers may be used. As shown, the bottommost layer 662 may be coupled to the second active device layer 652 using a via 661. In one implementation, the bottommost layer 662 may be the second interconnect layer 660 that is most proximate to the second active device layer 652.

The monolithic 3D IC 600 may also include one or more MIVs 630 used to electrically couple the first tier 610 and the second tier 650. For example, the MIVs 630 may be used to electrically couple the bottommost second interconnect layer 662 of the second interconnect layers 660 and the uppermost layer 628 of the first interconnect layers 620.

As also shown, the monolithic 3D IC 600 may also include a plurality of input structures 675 that may be disposed at least partially at a top side 670 of the second tier 650. The top side 670 may be the side of the second tier 650 that lies farthest away from the substrate (not pictured).

Further, the input structures 675 may be positioned at peripheral and/or central locations of the second tier 650, where the peripheral locations may be locations that are proximate to an edge of the second tier 650.

Each peripheral input structure 675 may include a solder bump 677 that is electrically coupled to a TSV 679. The solder bump 677 may be disposed at the top side 670 and configured to receive power, a clock signal, an input signal, or combinations thereof from an external source. The solder bumps 677 may be solder balls, metal pillars, controlled collapse chip connection (C4) bumps, and/or the like. The TSVs 679 may be electrically coupled to the layer 629 of the first interconnect layers 620. As such, the layer 629 may be configured to receive power, a clock signal, an input signal, or combinations thereof from the peripheral input structure 675. The layer 629 may be similarly configured to receive power, a clock signal, an input signal, or combinations thereof from the input structure 675. Using the first interconnect layers 620, the layer 629 may then provide the power and/or signals to the first active device layer 612 using a conductive path between the two layers. In particular, the conductive path may supply the power and signals to the one or more transistors 614.

Further, using the second interconnect layer 660, the uppermost layer 628, and the MIVs 630, the layer 629 may then provide the power and/or signals to the second active device layer 652 using a conductive path between the two layers. In particular, the conductive path may supply the power and signals to the one or more transistors 654. By coupling the TSVs to the larger layer 629 instead of using a larger uppermost layer 628, there may be less crowding of the interconnect layers in the IC 600.

2D IC Using Inter-Tier Vias

Figure 7:
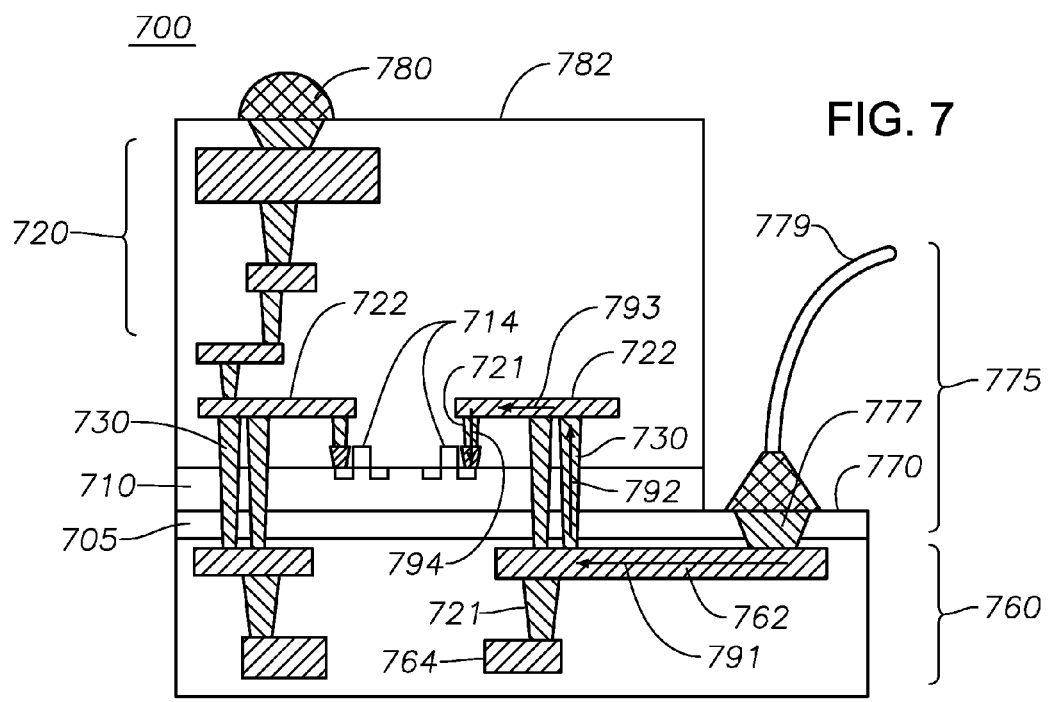
FIGS. 7-8 illustrates a cross-sectional view of a two-dimensional (2D) IC in accordance with various implementations described herein.

Implementations of using IVs in 2D ICs are described herein. In particular, a 2D IC may use IVs in order to receive power, a clock signal, an input signal, or combinations thereof from an external source. As noted above, the IVs may be in the form of TSVs, MIVs, and/or any other vias known to those skilled in the art. In another implementation, such IVs may be smaller than the TSVs mentioned above, and may be comparable in size to the MIVs discussed above. In one such implementation, FIG. 7 illustrates a cross-sectional view of a 2D IC 700 in accordance with various implementations described herein. The 2D IC 700 may be similar to the 2D ICs discussed above.

As shown, the 2D IC 700 includes an active device layer 710 disposed on a substrate layer (not shown). Further, as shown, a dielectric layer 705 may be positioned between the active device layer 710 and the substrate layer. The active device layer 710 may include various doped regions that form one or more transistors 714 in the layer 710.

The 2D IC 700 may also include multiple sets of first interconnect layers 720, where each set includes one to four interconnect layers. Those skilled in the art understand that more or less than four interconnect layers may be used. The first interconnect layers 720 include at least a bottommost first interconnect layer 722. The bottommost layer 722 of the first interconnect layers 720 may be coupled to the active device layer 710 using a via 721. For instances where a set of first interconnect layers 720 includes more than one layer, the bottommost layer 722 may be the first interconnect layer 720 that is most proximate to the active device layer 710. The first interconnect layer 720 may be disposed proximate to a top side of the active device layer 710. The top side of the active device layer 710 may be the side of the layer 710 that is farthest from the substrate (not pictured).

The 2D IC 700 may also include second interconnect layers 760, which include two interconnect layers 762 and 764. Although two interconnect layers are shown, those skilled in the art understand that more or less than two interconnect layers may be used. The second interconnect layers 760 may be disposed proximate to a bottom side of the active device layer 710. The bottom side of the active device layer 710 may be the side of the layer 710 that is closest to the substrate (not pictured). As shown, interconnect layers 762 and 764 may be electrically coupled to one another using vias 721. In one implementation, the uppermost layer 762 may be the second interconnect layer 760 that is most proximate to the active device layer 710.

The 2D IC 700 may also include one or more MIVs 730 used to electrically couple the bottommost first interconnect layer 722 and the uppermost second interconnect layer 762. As also shown, the 2D IC 700 may also include at least one peripheral input structure 775 that may be disposed at a top side 770 of the dielectric layer 705. The top side 770 may be the side of the dielectric layer 705 that lies farthest away from the substrate (not pictured). Further, the peripheral input structure 775 may be positioned at a peripheral location of the dielectric layer 705, where the peripheral location may be a location that is proximate to an edge of the dielectric layer 705. Due to the difference in size between the dielectric layer 705 and the active device layer 710, the peripheral input structure 775 may also be positioned to be adjacent to a side of the active device layer 710.

The peripheral input structure 775 may include a contact 777 that is electrically coupled to a wire-bond input 779. The wire-bond input 779 may be configured to receive power, a clock signal, an input signal, or combinations thereof from an external source. In another implementation, a solder bump similar to the solder bump 170 above may be used instead of a wire-bond input.

In addition, the contact 777 may also be electrically coupled to the uppermost layer 762 of the second interconnect layers 760. As such, the uppermost layer 762 may be configured to receive power, a clock signal, an input signal, or combinations thereof from the peripheral input structure 775. Using one instance of the bottommost first interconnect layer 722 and the MIVs 730, the uppermost layer 762 may then provide the power and/or signals to the active device layer 710 using a conductive path between the two layers. In particular, the conductive path may supply the power and signals to the one or more transistors 714. This conductive path is at least partly illustrated by arrows 791, 792, 793, and 794.

As is also shown in FIG. 7, the 2D IC 700 may also include a conductive path that is similar to the path described above with respect to the second tier 150 of FIG. 1, where the path may be formed from a solder bump 780, first interconnect layers 720, and MIVs 730. In such an implementation, the solder bump 780 and the peripheral input structure 775 may each receive power, the clock signal, or an input signal to be received by the active device layers. For example, the solder bump 780 may receive the input signal from an external source, whereas the peripheral input structure 775 may receive power from an external source. The solder bump 780 may be solder balls, metal pillars, controlled collapse chip connection (C4) bumps, and/or the like. The solder bumps 780 may also be positioned proximate to a center of the IC 700, and may be positioned on a top side 782 of a tier that has the active device layer 710. The top side 782 may correspond to the side of the IC 700 that lies farthest away from the substrate (not pictured).

Figure 8:
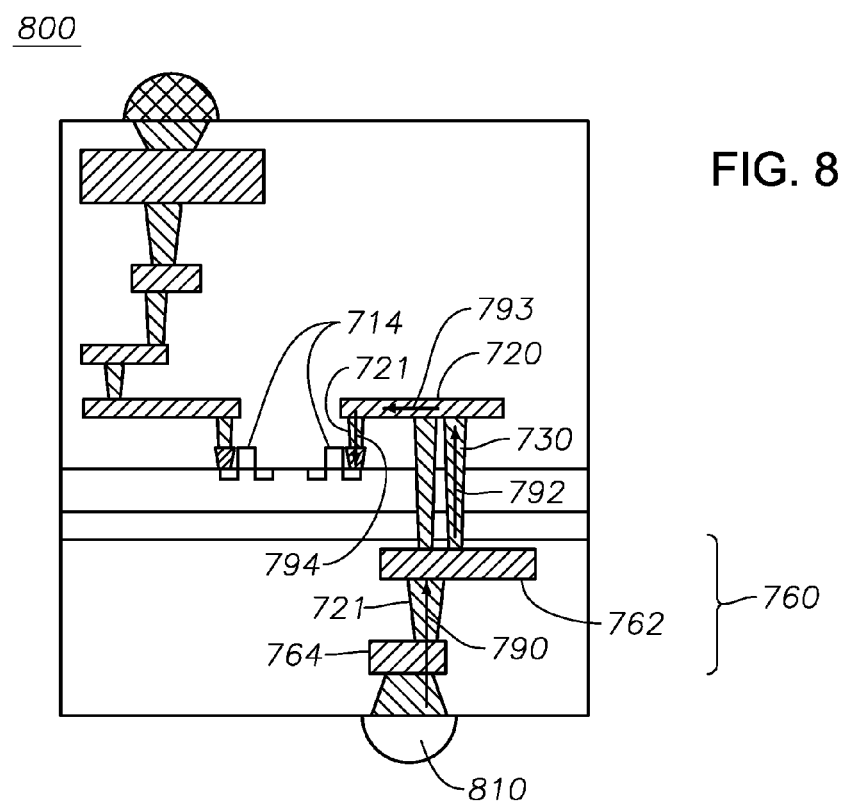

In another implementation, FIG. 8 illustrates a cross-sectional view of a 2D IC 800 in accordance with various implementations described herein. The 2D IC 800 may be similar to the 2D IC 700 discussed above, except a solder bump 810 may be used instead of the peripheral input structure 775. The solder bump 810 may be solder balls, metal pillars, controlled collapse chip connection (C4) bumps, and/or the like.

The solder bump 810 may be electrically coupled to the interconnect layer 764 of the second interconnect layers 760. As noted above, the second interconnect layers 760 may be disposed on a bottom side of the active device layer 710, and interconnect layers 762 and 764 may be electrically coupled to one another using vias 721. As such, the solder bump 810 may also be disposed on the bottom side of the active device layer 710.

The solder bump 810 may be configured to receive power, a clock signal, an input signal, or combinations thereof from an external source. As such, the layer 764 may be configured to receive power, a clock signal, an input signal, or combinations thereof from the solder bump 810. Using the first interconnect layer 720, the MIVs 730, and the uppermost layer 762, the layer 764 may then provide the power and/or signals to the active device layer 710 using a conductive path between the two layers. In particular, the conductive path may supply the power and signals to the one or more transistors 714. This conductive path is at least partly illustrated by arrows 790, 792, 793, and 794.

As explained above, various implementations of using IVs in ICs may be used. Such implementations may be used to attenuate electrical challenges in the IC, such as IR drop, clock signal lag and/or skew, and input signal degradation by providing a shorter conductive path between an external source and an active device layer.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A three-dimensional (3D) integrated circuit (IC), comprising:
   a plurality of tiers disposed on a substrate layer, wherein the plurality of tiers comprises:
   a first tier having a first active device layer electrically coupled to one or more first interconnect layers;
   a second tier having a second active device layer electrically coupled to a second interconnect layer, wherein the first tier is positioned closer to the substrate layer than the second tier, and wherein the one or more first interconnect layers include an uppermost first interconnect layer that is least proximate to the first active device layer of the first interconnect layers;

one or more first inter-tier vias (IVs) configured to couple to the second interconnect layer and to the uppermost first interconnect layer; and wherein the uppermost first interconnect layer is coupled to one or more peripheral input structures at one or more peripheral locations of the first tier, wherein the one or more peripheral input structures are configured to electrically couple the uppermost first interconnect layer to a power source, thereby electrically coupling the power source to the first active device layer and to the second active device layer.

2. The 3D IC of claim 1, wherein respective peripheral input structures comprise:
   a contact electrically coupled to the uppermost first interconnect layer; and
   a wire-bond input electrically coupled to the contact and configured to receive power from the power source.

3. The 3D IC of claim 2, wherein the first tier is larger in size than the second tier, and wherein the one or more peripheral locations are positioned to be adjacent to a side of the second tier.

4. The 3D IC of claim 1, wherein the one or more peripheral locations of the first tier comprise one or more locations that are proximate to an edge of the first tier.

5. The 3D IC of claim 1, wherein the uppermost first interconnect layer is configured to provide power to the first active device layer through the one or more first interconnect layers, and wherein the uppermost first interconnect layer is configured to provide power to the second active device layer through the one or more first IVs and the second interconnect layer.

6. The 3D IC of claim 1, wherein the first tier and the second tier are positioned approximately in the middle of the plurality of tiers.

7. The 3D IC of claim 1, wherein the 3D IC is a monolithic 3D IC, and wherein the first IVs comprise one or more monolithic inter-tier vias (MIVs).

8. The 3D IC of claim 1, wherein the one or more first interconnect layers and the second interconnect layer are composed of metal.

9. The 3D IC of claim 1, further comprising one or more input structures positioned proximate to a center of the 3D IC and positioned at least partially on a top side of the second tier, wherein the one or more input structures are configured to electrically couple the power source to the first active device layer and to the second active device layer using a plurality of metal layers and one or more second IVs.

10. The 3D IC of claim 9, wherein the one or more input structures comprise one or more solder bumps electrically coupled to the plurality of metal layers and the one or more second IVs.

11. The 3D IC of claim 1, wherein respective peripheral input structures comprise:
    a through silicon via (TSV) electrically coupled to the uppermost first interconnect layer; and
    a solder bump disposed at a top side of the second tier, electrically coupled to the TSV, and configured to receive power from the power source.

12. A three-dimensional (3D) integrated circuit (IC), comprising:
    a plurality of tiers disposed on a substrate layer, wherein the plurality of tiers comprises:
       a first tier having a first active device layer electrically coupled to one or more first interconnect layers;
       a second tier having a second active device layer electrically coupled to a second interconnect layer, wherein the first tier is positioned closer to the substrate layer than the second tier, and wherein the one or more first interconnect layers include an uppermost first interconnect layer that is least proximate to the first active device layer of the first interconnect layers;
    one or more first inter-tier vias (IVs) configured to electrically couple the second interconnect layer and the uppermost first interconnect layer;
    wherein the uppermost first interconnect layer is electrically coupled to a power source at one or more peripheral locations of the first tier, thereby electrically coupling the power source to the first active device layer and to the second active device layer;
    wherein the uppermost first interconnect layer is electrically coupled to the power source at the one or more peripheral locations of the first tier using one or more peripheral input structures, wherein respective peripheral input structures comprise:
       a first through silicon via (TSV) electrically coupled to the uppermost first interconnect layer; and
       a first solder bump disposed at a top side of the second tier, electrically coupled to the TSV, and configured to receive power from the power source; and
    further comprising one or more central input structures positioned proximate to a center of the 3D IC and coupled to the power source, wherein the one or more central input structures comprise:
       a second through silicon via (TSV) electrically coupled to the uppermost first interconnect layer; and
       a second solder bump disposed at the top side of the second tier, electrically coupled to the TSV, and configured to receive power from the power source.

13. A three-dimensional (3D) integrated circuit (IC), comprising:
    a plurality of tiers disposed on a substrate layer, wherein the plurality of tiers comprises:
       a first tier having a first active device layer electrically coupled to one or more first interconnect layers;
       a second tier having a second active device layer electrically coupled to a second interconnect layer, wherein the first tier is positioned closer to the substrate layer than the second tier, and wherein the one or more first interconnect layers include an uppermost first interconnect layer that is least proximate to the first active device layer of the first interconnect layers;
    one or more first inter-tier vias (IVs) configured to electrically couple the second interconnect layer and the uppermost first interconnect layer;
    wherein the uppermost first interconnect layer is electrically coupled to a power source at one or more peripheral locations of the first tier, thereby electrically coupling the power source to the first active device layer and to the second active device layer;
    wherein the uppermost first interconnect layer is electrically coupled to the power source at the one or more peripheral locations of the first tier using one or more peripheral input structures, wherein respective peripheral input structures comprise:
       a through silicon via (TSV) electrically coupled to the uppermost first interconnect layer; and
       a solder bump disposed at a top side of the second tier, electrically coupled to the TSV, and configured to receive power from the power source; and
    wherein the uppermost first interconnect layer is electrically coupled to an adjacent first interconnect layer, wherein:

the adjacent first interconnect layer is larger in pitch than the uppermost first interconnect layer; and the adjacent first interconnect layer is electrically coupled to the TSV, thereby electrically coupling the TSV to the uppermost first interconnect layer.

14. A three-dimensional (3D) integrated circuit (IC), comprising:

a plurality of tiers disposed on a substrate layer, wherein the plurality of tiers comprises:

a first tier having a first active device layer electrically coupled to one or more first interconnect layers;

a second tier having a second active device layer electrically coupled to one or more second interconnect layers, wherein the first tier is positioned closer to the substrate layer than the second tier, and wherein the one or more first interconnect layers include an uppermost first interconnect layer that is least proximate to the first active device layer of the first interconnect layers;

one or more first inter-tier vias (IVs) configured to couple to one of the one or more second interconnect layers and to the uppermost first interconnect layer; and wherein the uppermost first interconnect layer is coupled to one or more peripheral input structures at one or more peripheral locations of the first tier, wherein the one or more peripheral input structures are configured to electrically couple the uppermost first interconnect layer to a clock source, an input signal source, or combinations thereof, thereby electrically coupling the clock source, the input signal source, or combinations thereof to the first active device layer and to the second active device layer.

15. The 3D IC of claim 14, wherein respective peripheral input structures comprise:

a contact electrically coupled to the uppermost first interconnect layer; and a wire-bond input electrically coupled to the contact and configured to receive one or more signals from the clock source, the input signal source, or combinations thereof.

16. The 3D IC of claim 14, wherein the one or more peripheral locations of the first tier comprise one or more locations that are proximate to an edge of the first tier.

17. The 3D IC of claim 14, wherein the uppermost first interconnect layer is configured to provide one or more signals from the clock source, the input signal source, or combinations thereof to the first active device layer through the one or more first interconnect layers, and wherein the uppermost first interconnect layer is configured to provide the one or more signals from the clock source, the input signal source, or combinations thereof to the second active device layer through the one or more first IVs and the one or more second interconnect layers.

18. An integrated circuit, comprising:

an active device layer disposed on a substrate layer;

one or more first interconnect layers disposed on a top side of the active device layer and electrically coupled to the active device layer, wherein the one or more first interconnect layers include a bottommost first interconnect layer that is most proximate to the active device layer of the first interconnect layers;

one or more second interconnect layers disposed on a bottom side of the active device layer, wherein the one or more second interconnect layers include an uppermost second interconnect layer that is most proximate to the active device layer of the second interconnect layers;

one or more first inter-tier vias (IVs) configured to couple to the bottommost first interconnect layer and to the uppermost second interconnect layer; and wherein the one or more second interconnect layers is electrically coupled to a power source, a clock source, an input signal source, or combinations thereof, thereby electrically coupling the power source, the clock source, the input signal source, or combinations thereof to the active device layer.

19. The integrated circuit of claim 18, wherein the uppermost second interconnect layer is electrically coupled to the power source, the clock source, the input signal source, or combinations thereof at one or more peripheral locations of the integrated circuit.

20. The integrated circuit of claim 18, further comprising a solder bump disposed on the bottom side of the active device layer, wherein the solder bump is electrically coupled to the power source, the clock source, the input signal source, or combinations thereof, and wherein the one or more second interconnect layers is electrically coupled to the solder bump.

* * * * *